United States Patent
Yasuhiro

(10) Patent No.: US 9,500,909 B2
(45) Date of Patent: Nov. 22, 2016

(54) LIQUID CRYSTAL DISPLAY PANEL AND MANUFACTURING METHOD THEREOF

(71) Applicant: Ye Xin Technology Consulting Co., Ltd., Hsinchu (TW)

(72) Inventor: Mizuno Yasuhiro, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/587,449

(22) Filed: Dec. 31, 2014

(65) Prior Publication Data

US 2016/0178967 A1    Jun. 23, 2016

(30) Foreign Application Priority Data

Dec. 22, 2014 (CN) .......................... 2014 1 0801183

(51) Int. Cl.
| | |
|---|---|
| H01L 21/00 | (2006.01) |
| H01L 21/84 | (2006.01) |
| H01L 35/24 | (2006.01) |
| H01L 51/00 | (2006.01) |
| G02F 1/1335 | (2006.01) |
| G02F 1/1337 | (2006.01) |
| H01L 27/12 | (2006.01) |
| G02F 1/1343 | (2006.01) |
| G02F 1/1368 | (2006.01) |
| G02F 1/1362 | (2006.01) |

(52) U.S. Cl.
CPC ....... *G02F 1/133784* (2013.01); *G02F 1/1368* (2013.01); *G02F 1/13439* (2013.01); *G02F 1/133512* (2013.01); *G02F 1/133514* (2013.01); *G02F 1/133788* (2013.01); *G02F 1/136227* (2013.01); *H01L 27/1262* (2013.01); *G02F 2001/133519* (2013.01); *G02F 2001/133773* (2013.01)

(58) Field of Classification Search
CPC ...................... G02F 1/133784; H01L 27/1262
USPC .............................. 257/40; 438/158; 349/96
See application file for complete search history.

(56) References Cited

U.S. PATENT DOCUMENTS

| | | | | |
|---|---|---|---|---|
| 4,776,675 | A | * | 10/1988 | Takaochi .......... G02F 1/133516 349/106 |
| 5,236,793 | A | * | 8/1993 | Nishiwaki .............. G02B 5/201 349/106 |
| 2002/0105604 | A1 | * | 8/2002 | Ha ..................... G02F 1/133555 349/43 |
| 2014/0253847 | A1 | * | 9/2014 | Saneto .............. G02F 1/133528 349/96 |
| 2015/0168753 | A1 | * | 6/2015 | Shen ................. G02F 1/133788 349/42 |

FOREIGN PATENT DOCUMENTS

| | | |
|---|---|---|
| CN | 103513468 A | 1/2014 |
| JP | 08-328041 A | 12/1996 |
| JP | P2002-244138 A | 8/2002 |
| JP | P2006-195111 A | 7/2006 |
| JP | P2009-271390 A | 11/2009 |
| TW | 201040618 A | 11/2010 |

* cited by examiner

*Primary Examiner* — David S Blum
(74) *Attorney, Agent, or Firm* — Zhigang Ma

(57) ABSTRACT

The present disclosure provides a liquid crystal display panel. The liquid crystal display panel includes a first substrate, a second substrate, and a liquid crystal layer. The liquid crystal layer is between the first substrate and the second substrate. The first substrate includes a first alignment layer. The second substrate includes a second alignment layer. The first alignment layer is a photo alignment layer. The second substrate is a rubbing alignment layer.

13 Claims, 8 Drawing Sheets

LIQUID CRYSTAL DISPLAY PANEL AND MANUFACTURING METHOD THEREOF

FIELD

The subject matter herein generally relates to a liquid crystal display panel and a method of manufacturing the liquid crystal display panel.

BACKGROUND

Because liquid crystal display panels have the advantages of portability, low power consumption, and low radiation, they have been widely used in various portable information products such as notebooks, personal digital assistants (PDAs), video cameras, and the like.

BRIEF DESCRIPTION OF THE DRAWINGS

Implementations of the present technology will now be described, by way of example only, with reference to the attached figures.

DETAILED DESCRIPTION

Figure 1:
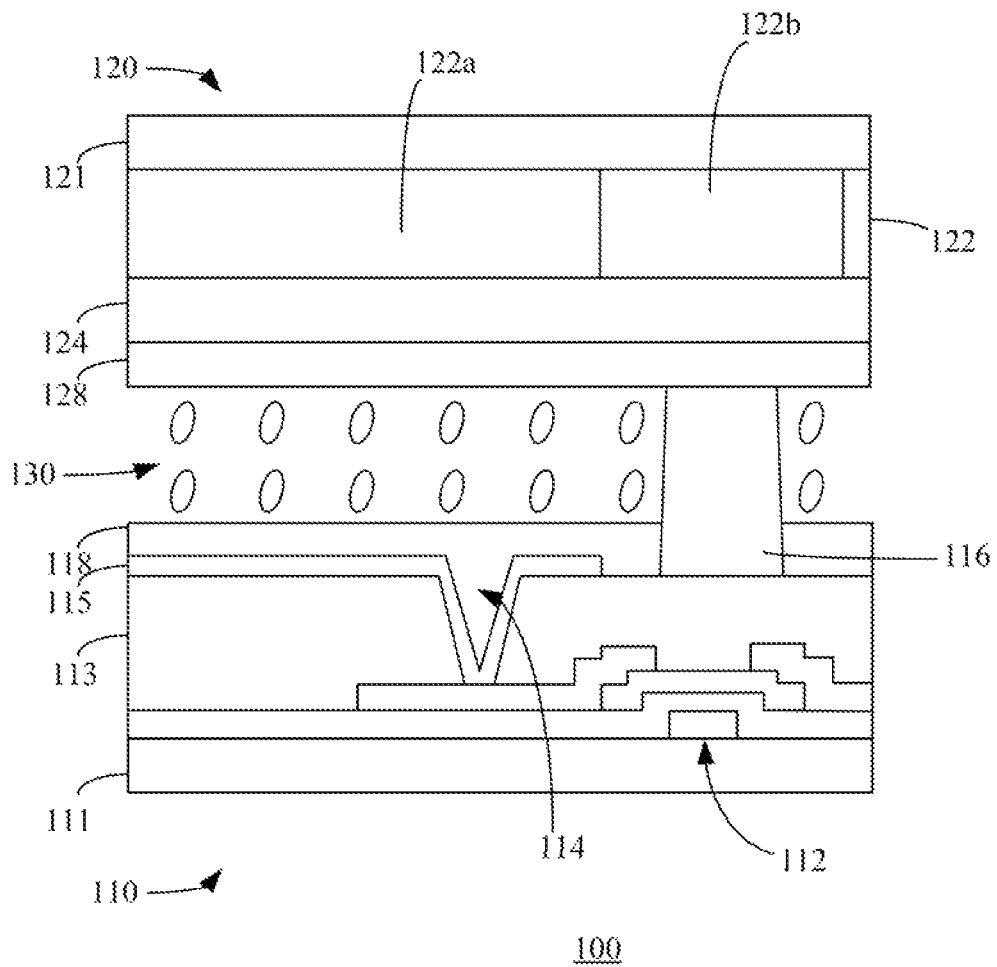
FIG. 1 is a cross-sectional view of a liquid crystal display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

A liquid crystal display panel may include a thin film transistor array substrate, a color filter substrate, and a liquid crystal layer between the thin film transistor array substrate and the color filter substrate. Two alignment layers are formed on the thin film transistor array substrate and the color filter substrate respectively.

Some manufactures use a photo aligning method to form the two alignment layers on the two substrates, and some other manufactures use a rubbing aligning method to form the two alignment layers on the two substrates.

However, in our research, a rubbing alignment process may induce a light leak defect, and a photo alignment process may make color filters of the liquid crystal display panel to be metamorphic which reduces a contrast ratio of the liquid crystal display panel.

For the defects above, our embodiments apply a rubbing alignment process on the color filter substrate, and apply a photo alignment process on the thin film transistor array substrate. Thus, the light leak defect and the low contrast ratio defect are averted.

FIG. 1 is a cross-sectional view of a liquid crystal display panel 100. FIG. 1 illustrates that the liquid crystal display panel 100 includes a first substrate 110, a second substrate 120, a liquid crystal layer 130, and a spacer 116. The liquid crystal layer 130 and the spacer 116 are between the first substrate 110 and the second substrate 120. The spacer 116 maintains a space between the first substrate 110 and the second substrate 120. In this embodiment, the first substrate 110 is a thin film transistor array substrate. The second substrate 120 is a color filter substrate.

The first substrate 110 includes a first substratum 111, a plurality of thin film transistors 112, a passivation layer 113, a transparent electrode 115, and a first alignment layer 118. The thin film transistor 112 is formed on the first substratum 111. The passivation layer 113 is formed on the first substratum 111 and covers the thin film transistor 112. A through hole 114 is defined in the passivation layer 113. The transparent electrode 115 is formed on the passivation layer 113 and is coupled with the thin film transistor 112 via the through hole 114. The first alignment layer 118 is formed on the transparent electrode 115. The first alignment layer 118 is a photo alignment layer. The photo alignment layer may control an alignment direction of liquid crystal molecules in the liquid crystal layer 130 adjacent to the photo alignment layer after the photo alignment layer is photo aligned via a photo alignment process. The first alignment layer 118 is disposed between the first substratum 111 and the liquid crystal layer 130. In this embodiment, the first alignment layer 118 is made of polyimide or other materials selected for a photo alignment process.

The second substrate 120 includes a second substratum 121, a color filter layer 122, an overcoating layer 124, and a second alignment layer 128. The color filter layer 122 is formed on the second substratum 121. The color filter layer 122 includes a plurality of color filter units 122a and a plurality of black matrixes 122b spacing each two adjacent color filter units 122a. The overcoating layer 124 is formed on the color filter layer 122. The second alignment layer 128 is formed on the overcoating layer 124. The second alignment layer 128 is a rubbing alignment layer. The rubbing alignment layer may control an alignment direction of liquid crystal molecules in the liquid crystal layer 130 adjacent to the rubbing alignment layer after the rubbing alignment layer is rubbing aligned via a rubbing alignment process. The second alignment layer 128 is disposed between the second substratum 121 and the liquid crystal layer 130. In this embodiment, the second alignment layer 128 is made of polystyrene, polyacrylate, or other materials selected for a rubbing alignment process.

Figure 2:
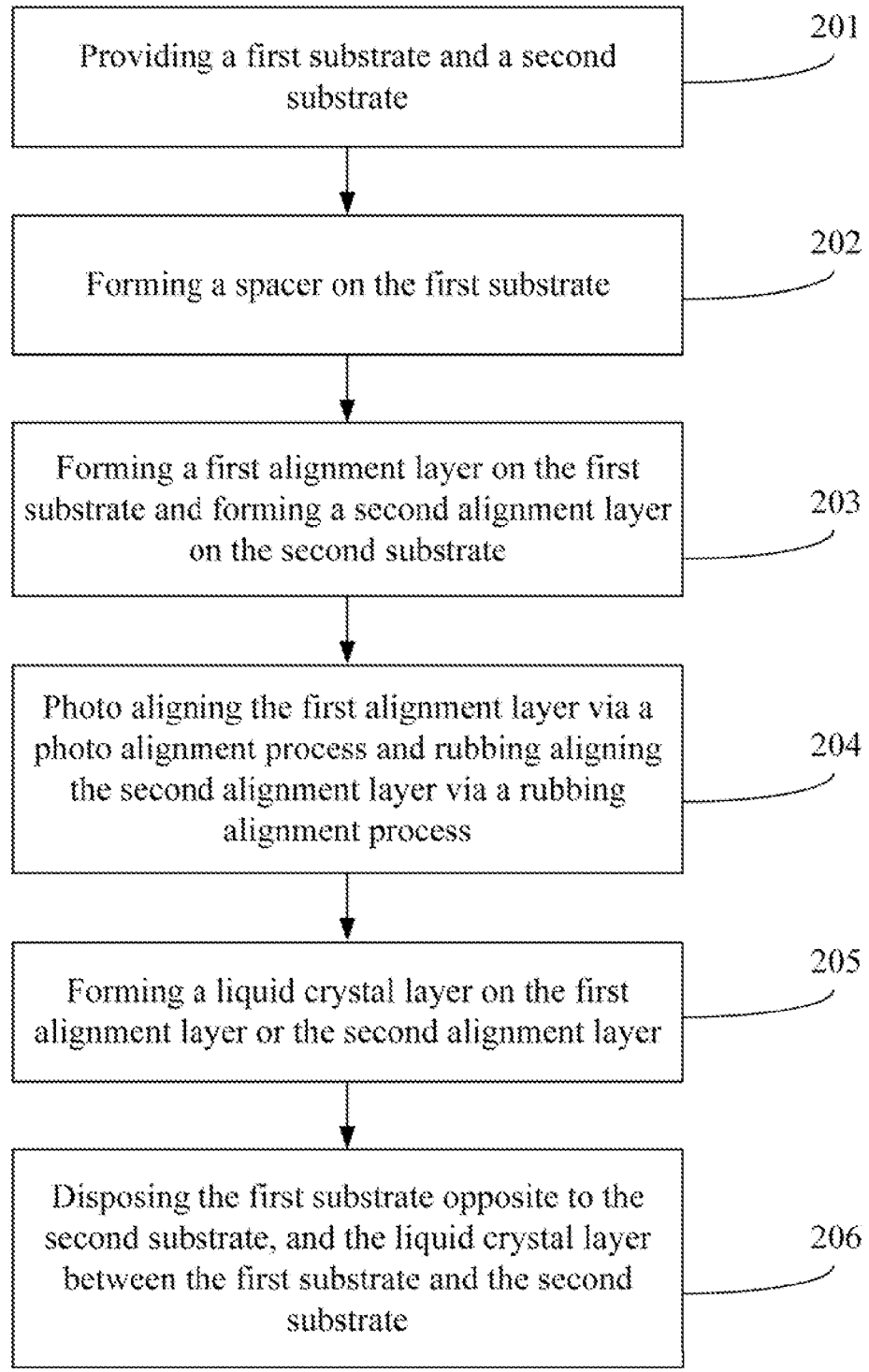
FIG. 2 is a flowchart for manufacturing the liquid crystal display panel of FIG. 1.

Referring to FIG. 2, a flowchart is presented in accordance with an example embodiment which is being thus illustrated. The example method is provided by way of example, as there are a variety of ways to carry out the method. The method described below can be carried out using the configurations illustrated in FIGS. 3 to 9, for example, and various elements of these figures are referenced in explaining example method. Each block shown in FIG. 2 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 201.

Figure 3:
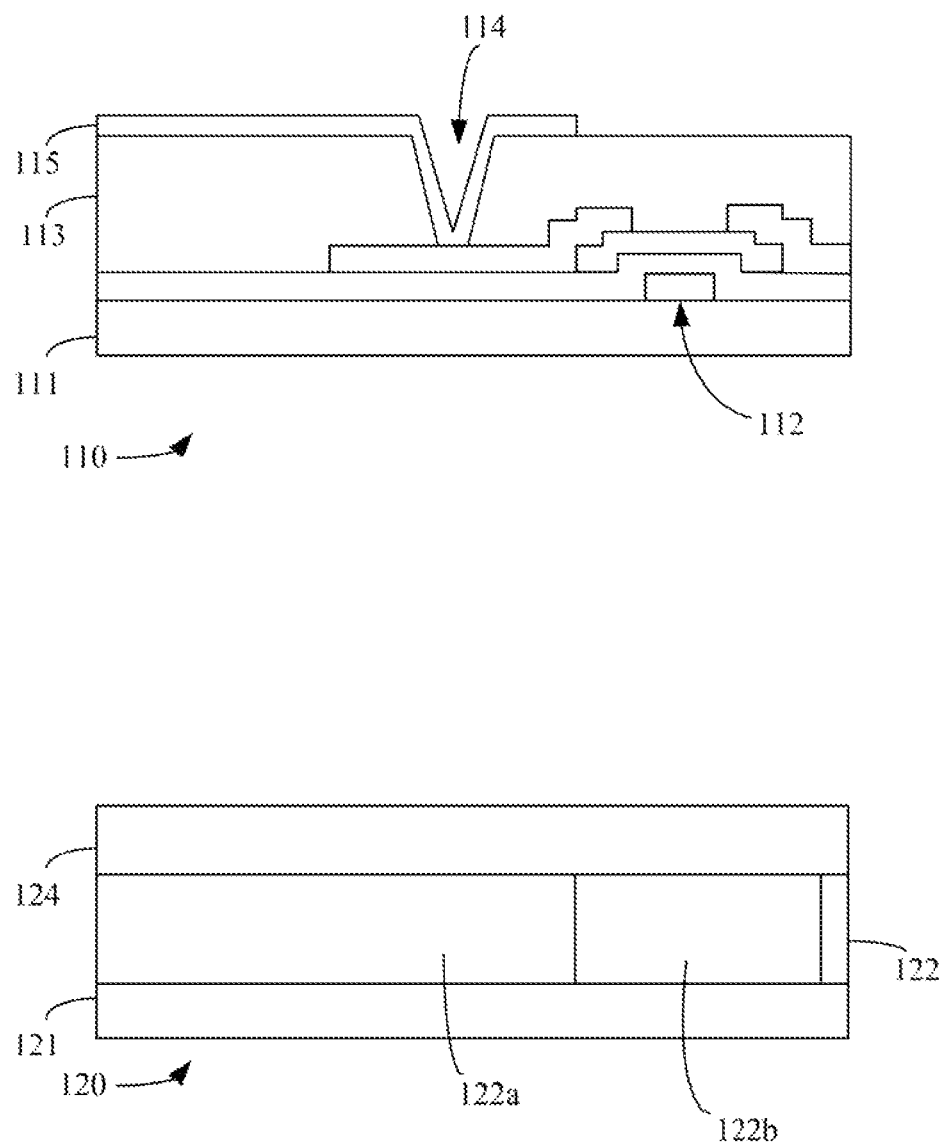
FIG. 3 illustrates that a first substrate and a second substrate are provided.

At block 201, referring to FIG. 3, a first substrate 110 and a second substrate 120 are provided. In this embodiment, the first substrate 110 is a thin film transistor array substrate. The second substrate 120 is a color filter substrate.

The first substrate 110 includes a first substratum 111, a thin film transistor 112, a passivation layer 113, a transparent electrode 115, and a first alignment layer 118 (not shown). The thin film transistor 112 is formed on the first substratum 111. The passivation layer 113 is formed on the first substratum 111 and covers the thin film transistor 112. A through hole 114 is defined in the passivation layer 113. The transparent electrode 115 is formed on the passivation layer 113 and is coupled with the thin film transistor 112 via the through hole 114.

The second substrate 120 includes a second substratum 121, a color filter layer 122, an overcoating layer 124, and a second alignment layer 128 (not shown). The color filter layer 122 is formed on the second substratum 121. The color filter layer 122 includes a plurality of color filter units 122a and a plurality of black matrixes 122b spacing each two adjacent color filter units 122a. The overcoating layer 124 is formed on the color filter layer 122.

Figure 4:
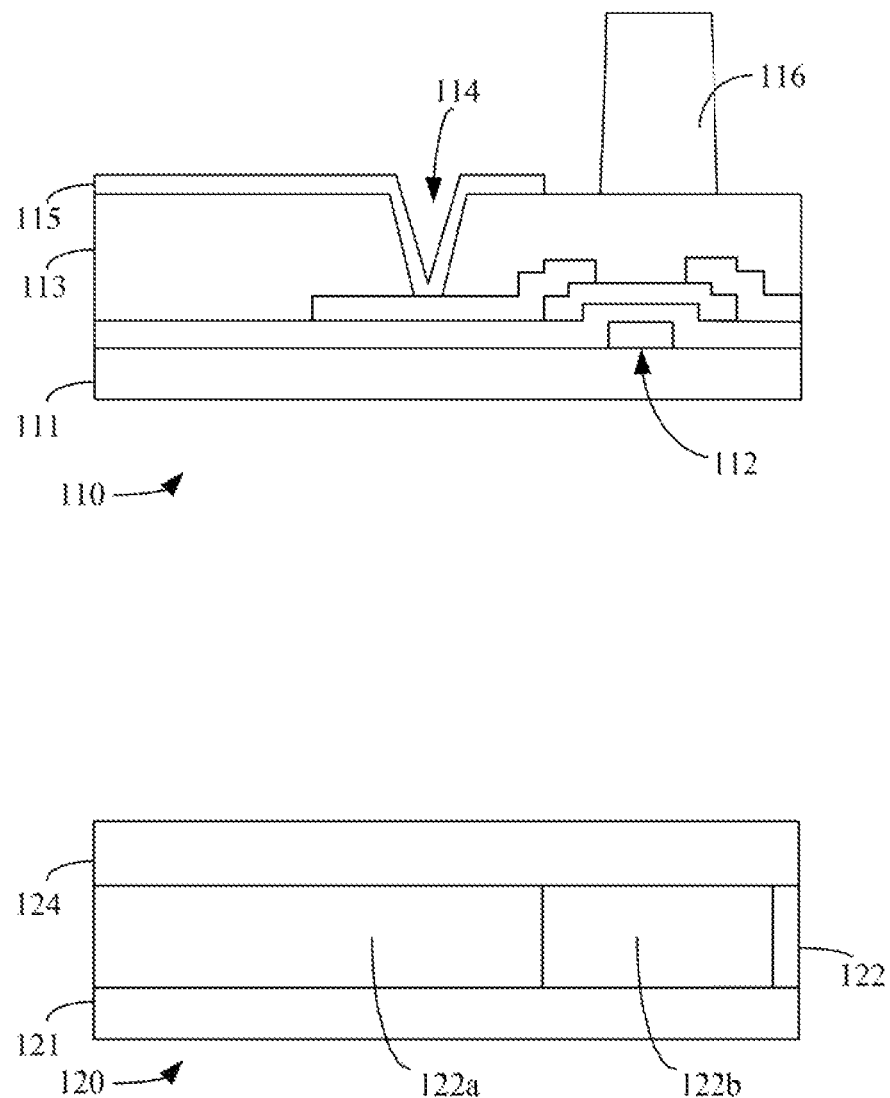
FIG. 4 illustrates that a spacer is formed on the first substrate.

At block 202, referring to FIG. 4, a spacer 116 is formed on the first substrate 110. It is understood that, the spacer 116 may also be formed on the second substrate 120.

Figure 5:
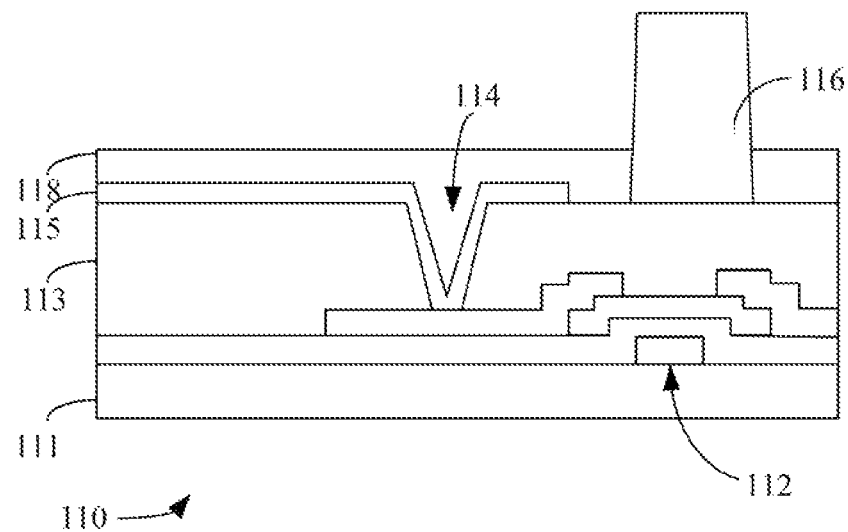
FIG. 5 illustrates that a first alignment layer is formed on the first substrate, and a second alignment layer is formed on the second substrate.
Figure 5:
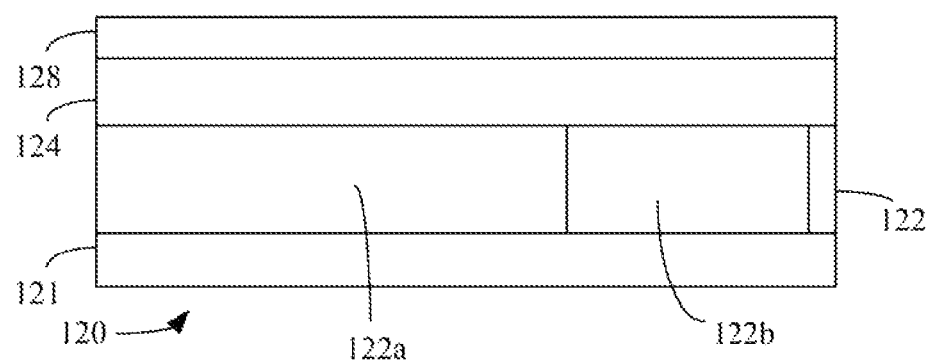

At block 203, referring to FIG. 5, a first alignment layer 118 is formed on the first substrate 110, and a second alignment layer 128 is formed on the second substrate 120. The first alignment layer 118 is a photo alignment layer. The photo alignment layer may control an alignment direction of liquid crystal molecules in the liquid crystal layer 130 adjacent to the photo alignment layer after the photo alignment layer is photo aligned via a photo alignment process. The first alignment layer 118 is made of polyimide or other materials selected for a photo alignment process. The second alignment layer 128 is a rubbing alignment layer. The rubbing alignment layer may control an alignment direction of liquid crystal molecules in the liquid crystal layer 130 adjacent to the rubbing alignment layer after the rubbing alignment layer is rubbing aligned via a rubbing alignment process. The second alignment layer 128 is made of polystyrene, polyacrylate, or other materials selected for a rubbing alignment process.

Figure 6:
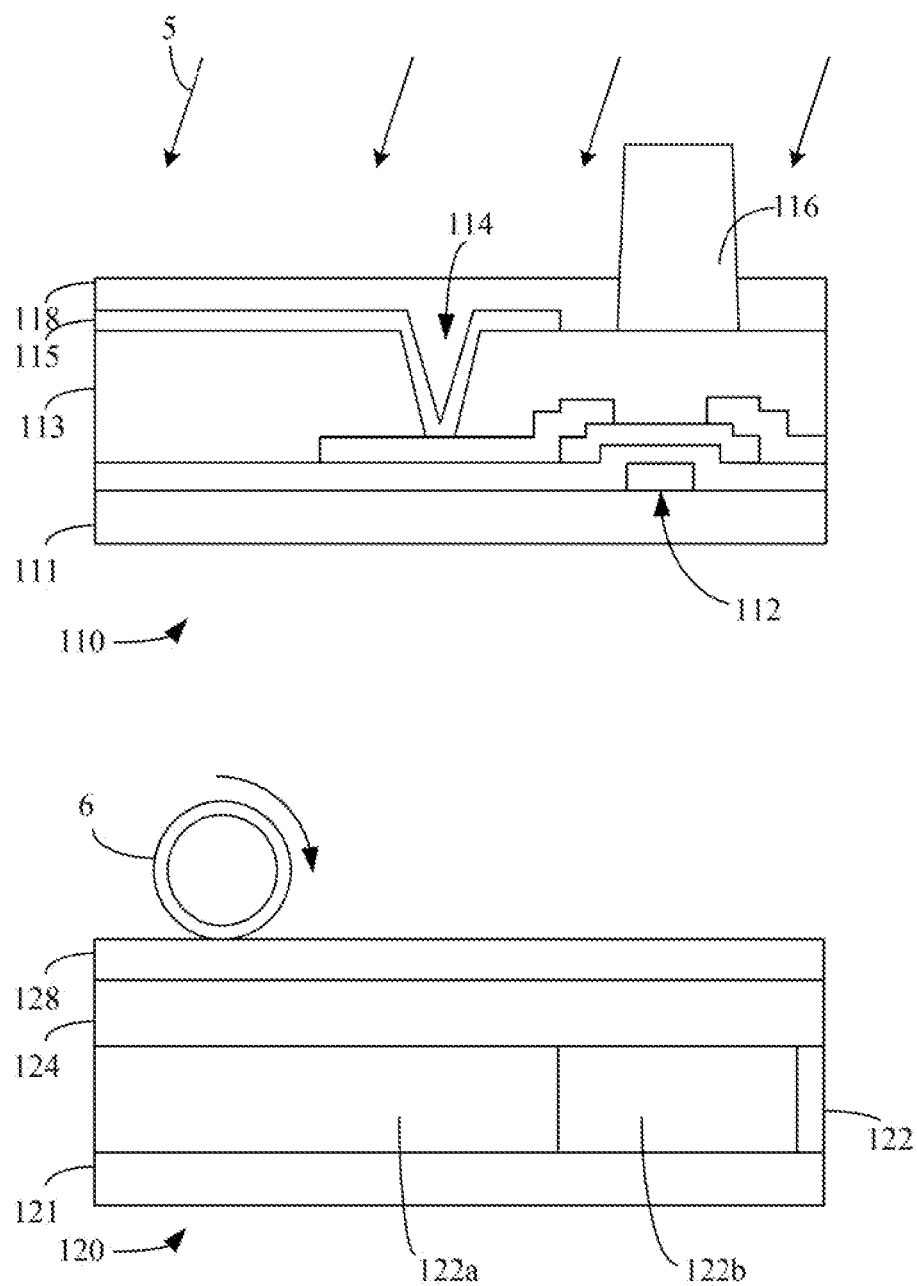
FIG. 6 illustrates that the first alignment layer and the second alignment layer are aligned.

At block 204, referring to FIG. 6, the first alignment layer 118 is photo aligned via a photo alignment process, and the second alignment layer 128 is rubbing aligned via a rubbing alignment process. In this embodiment, an alignment light 5 is irradiated on the first alignment layer 118 to align the first alignment layer 118. Specifically, the alignment light 5 is ultraviolet (UV) light. A wheel 6 is rolled on the second alignment layer 128 to align the second alignment layer 128.

Figure 7:
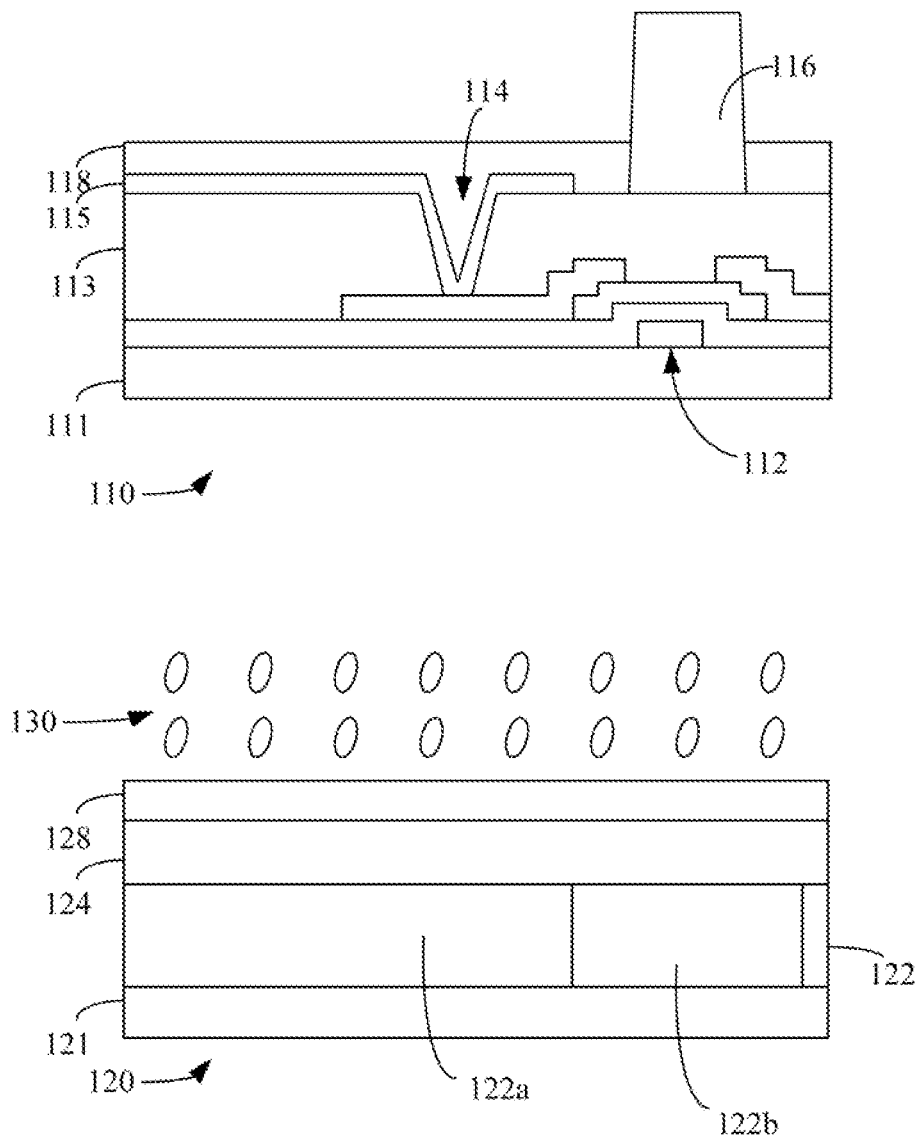
FIG. 7 illustrates that a liquid crystal layer is formed on the second alignment layer.
Figure 8:
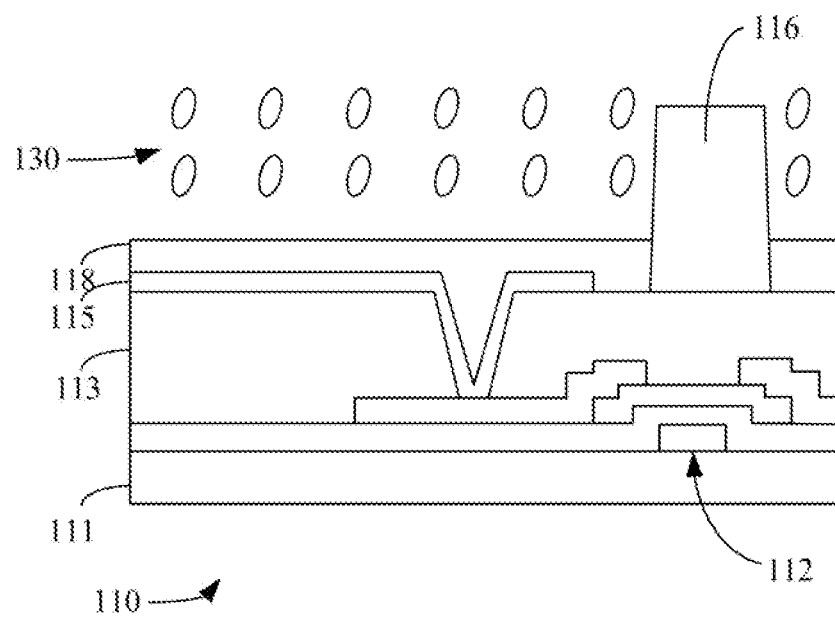
FIG. 8 illustrates that the liquid crystal layer is formed on the first alignment layer.
Figure 8:
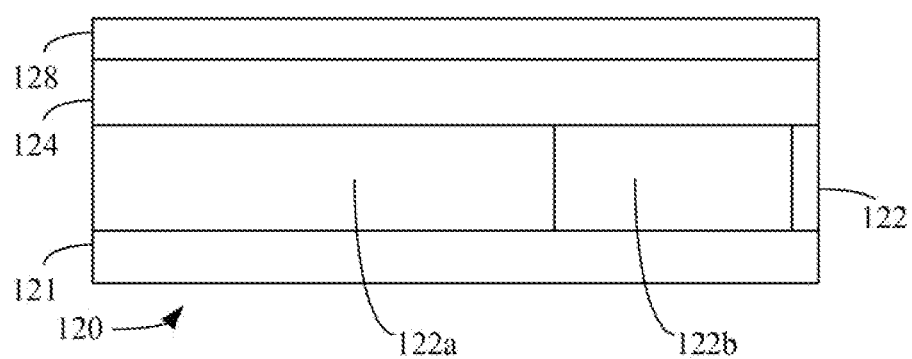

At block 205, a liquid crystal layer 130 is formed on the first alignment layer 118 or the second alignment layer 128. FIG. 7 illustrates that in this embodiment, the liquid crystal layer 130 is formed on the second alignment layer 128. FIG. 8 illustrates in another embodiment, the liquid crystal layer 130 is formed on the first alignment layer 118.

At block 206, referring to FIG. 1, the first substrate 110 is disposed opposite to the second substrate 120, and the liquid crystal layer 130 and the spacer 116 are between the first substrate 110 and the second substrate 120. The present liquid crystal display panel 100 is thus obtained.

In above-mentioned disclosure, the photo alignment process is applied to the thin film transistor array substrate 110 for avoiding a light leak, and the rubbing alignment process is applied to the second substrate 120 (e.g., a color filter substrate) for avoiding the color filter 122 being metamorphic, and thus, the liquid crystal display panel 100 manufactured by the method has a good display effect.

The embodiments shown and described above are only examples. Many details are often found in the art such as the other features of a liquid crystal display panel. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A liquid crystal display panel, comprising:
   a first substrate comprising a first alignment layer, the first substrate being a thin film transistor array substrate;
   a second substrate comprising a second alignment layer, the second substrate being a color filter substrate; and
   a liquid crystal layer between the first substrate and the second substrate,
   wherein the first alignment layer is a photo alignment layer, the second alignment layer is a rubbing alignment layer.

2. The liquid crystal display panel of claim 1, wherein the first substrate further comprises a first substratum, the second substrate further comprises a second substratum, the first alignment layer is disposed between the first substratum and the liquid crystal layer, the second alignment layer is disposed between the second substratum and the liquid crystal layer.

3. The liquid crystal display panel of claim 2, wherein the first substrate further comprises a thin film transistor, a passivation layer, and a transparent electrode, the thin film transistor is formed on the first substratum, the passivation layer is formed on the first substratum and covers the thin film transistor, a through hole is defined in the passivation layer, the transparent electrode is formed on the passivation layer and is coupled with the thin film transistor by the through hole, the first alignment layer is formed on the transparent electrode.

4. The liquid crystal display panel of claim 2, wherein the second substrate further comprises a color filter layer and an overcoating layer, the color filter layer is formed on the second substratum, the color filter layer includes a plurality of color filter units and a plurality of black matrices spaced between each of two adjacent color filter units, the overcoating layer is formed on the color filter layer, the second alignment layer is formed on the overcoating layer.

5. A method of manufacturing a liquid crystal display panel, comprising:
- providing a first substrate and a second substrate, the first substrate being a thin film transistor array substrate, the second substrate being a color filter substrate;
- forming a first alignment layer on the first substrate and forming a second alignment layer on the second substrate;
- photo aligning the first alignment layer via a photo alignment process and rubbing aligning the second alignment layer via a rubbing alignment process;
- forming a liquid crystal layer on the first alignment layer or the second alignment layer; and
- disposing the first substrate opposite to the second substrate, and the liquid crystal layer between the first substrate and the second substrate.

6. The method of claim 5, wherein a spacer is formed on the first substrate before the first alignment layer is formed.

7. The method of claim 5, wherein an alignment light is irradiated on the first alignment layer to align the first alignment layer during the photo alignment process.

8. The method of claim 5, wherein a wheel is rolled on the second alignment layer to align the second alignment layer during the rubbing alignment process.

9. The method of claim 5, wherein the first substrate comprises a first substratum, a thin film transistor, and a passivation layer, the thin film transistor is formed on the first substratum, the passivation layer is formed on the first substratum and covers the thin film transistor.

10. The method of claim 9, wherein a through hole is defined in the passivation layer, the first substrate further comprises a transparent electrode, the transparent electrode is formed on the passivation layer and is coupled with the thin film transistor by the through hole.

11. The method of claim 10, wherein the first alignment layer is formed on the transparent electrode.

12. The method of claim 5, wherein the second substrate further comprises a color filter layer and an overcoating layer, the color filter layer is formed on the second substratum, the color filter layer includes a plurality of color filter units and a plurality of black matrices spaced between each of two adjacent color filter units, the overcoating layer is formed on the color filter layer.

13. The method of claim 12, wherein the second alignment layer is formed on the overcoating layer.

* * * * *